(12) United States Patent
Maiers (10) Patent No.: US 6,764,344 B2
(45) Date of Patent: Jul. 20, 2004

(54) DISC DRIVE CIRCUIT BOARD EDGE CONNECTOR

(75) Inventor: Michael Alan Maiers, Longmont, CO (US)

(73) Assignee: Seagate Technology LLC, Scotts Valley, CA (US)

(*) Notice: Subject to any disclaimer, the term of this patent is extended or adjusted under 35 U.S.C. 154(b) by 201 days.

(21) Appl. No.: 10/034,078

(22) Filed: Dec. 27, 2001

(65) Prior Publication Data

US 2003/0003809 A1 Jan. 2, 2003

Related U.S. Application Data

(60) Provisional application No. 60/302,517, filed on Jul. 2, 2001.

(51) Int. Cl.[7] .............................................. H01R 24/00
(52) U.S. Cl. ...................................... 439/629; 439/65
(58) Field of Search ............................. 439/79, 80, 83, 439/876, 629, 630, 633, 328, 59, 65, 61; 361/753, 792

(56) References Cited

U.S. PATENT DOCUMENTS

| | | | |
|---|---|---|---|
| 4,695,112 A | | 9/1987 | Maston et al. .............. 439/350 |
| 5,013,247 A | | 5/1991 | Watson ........................ 439/55 |
| 5,035,641 A | | 7/1991 | Van-Santbrink et al. .... 439/329 |
| 5,319,523 A | * | 6/1994 | Ganthier et al. ............ 361/753 |
| 5,383,788 A | | 1/1995 | Spencer ....................... 439/67 |
| 5,393,234 A | | 2/1995 | Yamada et al. ............... 439/62 |
| 5,403,202 A | * | 4/1995 | Roehling ..................... 439/493 |
| 5,549,480 A | * | 8/1996 | Cheng .......................... 439/79 |
| 5,609,490 A | * | 3/1997 | Beesch et al. ................ 439/79 |
| 5,692,910 A | * | 12/1997 | Mittal ......................... 439/59 |
| 5,807,126 A | | 9/1998 | Bethurum .................... 439/259 |
| 5,897,386 A | * | 4/1999 | Baxter et al. ................ 439/79 |
| 6,007,359 A | | 12/1999 | Kosmala ..................... 439/329 |
| 6,062,911 A | * | 5/2000 | Davis et al. ................. 439/630 |
| 6,135,782 A | * | 10/2000 | Cox et al. .................... 439/65 |
| 6,231,363 B1 | | 5/2001 | Kosmala ..................... 439/260 |
| 6,250,932 B1 | * | 6/2001 | Smith et al. .................. 439/61 |
| 6,302,700 B1 | * | 10/2001 | Puri et al. .................... 439/59 |
| 6,312,265 B1 | * | 11/2001 | Mohtar et al. ................ 439/79 |
| 6,375,486 B1 | * | 4/2002 | Yu ............................. 439/347 |
| 6,572,384 B1 | * | 6/2003 | Marchevsky ................. 439/43 |

OTHER PUBLICATIONS

Title: Serial ATA: High Speed Serialized AT Attachment; Authors: APT Technologies, Inc., Dell Computer Corp., IBM Corp., Intel Corp., Maxtor Corp., Seagate Technology.

* cited by examiner

Primary Examiner—Alex Gilman
(74) Attorney, Agent, or Firm—Merchant & Gould P.C.

(57) ABSTRACT

A circuit board connector for connecting a disc drive circuit board to a device outside the disc drive includes a circuit board tab forming part of the circuit board and extending from the circuit board tab. Contact pads are formed on the circuit board tab. A housing attached to the circuit board includes a housing tab extending from the housing, the housing tab being substantially parallel and adjacent to the circuit board tab, such that the circuit board tab and the housing tab together form a connecting tab.

20 Claims, 7 Drawing Sheets

DISC DRIVE CIRCUIT BOARD EDGE CONNECTOR

RELATED APPLICATIONS

This application claims priority of U.S. provisional patent application No. 60/302,517 filed on Jul. 2, 2001 and titled "CARD EDGE SERIAL ATA INTERFACE."

FIELD OF THE INVENTION

This application relates generally to storage devices and more particularly to a printed circuit board connector for a storage device.

BACKGROUND OF THE INVENTION

Data is transferred between a host computer and a storage device, such as a disc drive, by way of an interface, which typically includes a buffer to facilitate high-speed data transfer between the host computer and the storage device. Data to be written to or read from the storage device is thus passed between the host computer and the storage device interface and between the interface and a read/write channel. Generally, the storage device interface includes hardware and/or software that regulates transmission of data and manages the exchange of data between the storage device and the host computer. A standard committee such as American National Standard Institute (ANSI) oversees the adoption of an interface protocol by which any peripheral device following the common standard can be used interchangeably.

Although various types of storage device interface standards exist, the Advanced Technology Attachment (ATA) interface standard is widely used for interfaces between host computers and storage devices, such as disc drives. The ATA interface is an official ANSI standard designation for the interface between a storage device and a host computer. Generally, the ATA standard specification deals with the power and data signals interface between the motherboard in the host computer and the storage device controller in the storage device.

In connecting a disc drive to one more computers, the ATA interface standard introduces an interconnect specification. A previous ATA standard was known as the parallel ATA (PATA) interconnect specification. Originally introduced in the 1980s, the PATA interconnect specification has been the dominant internal storage interconnect for desktop and mobile computers. It has been used to connect storage devices such as hard drives, digital video disc drives, and compact disc drives to the motherboard. However, PATA has a number of limitations that are exhausting its ability to continue increasing performance to meet the demands of evolving storage devices and host computers.

The limitations in the PATA interconnect specification have led to the development of a new ATA specification, known as serialized, or serial, ATA. The serialized ATA specification includes detailed geometric dimensions for connections between the storage device and connecting cables or host computers. The specification calls for a device signal plug connector and a device power plug connector, each with different dimensions. The device plug connectors have contact pads formed on tabs extending from the device plug connectors. The device plug connectors further include leads extending from the contact pads to the circuit board of the storage device. The device plug connectors are often mounted onto storage device circuit boards and the leads from the device plug connectors are soldered onto electrically conductive elements of the circuit boards. Accordingly, the device plug connectors have incorporated contact pads and leads.

The contact pads and leads increase the manufacturing costs of the device plug connectors. Additionally, the procedure of connecting each lead of the device plug connectors to the circuit board increases manufacturing costs. For example, the circuit board and the connectors must be handled delicately during manufacturing to maintain the position of the solder contacts until they are soldered together. Accordingly there is a need for an improved circuit board edge connector that is compatible with standard specifications, such as the serialized ATA standards.

SUMMARY OF THE INVENTION

Against this backdrop the present invention has been developed. An embodiment of the present invention may be summarized as a connector for connecting a disc drive circuit board to a device outside the disc drive. The connector includes a circuit board tab forming part of the circuit board and extending from it. Contact pads are formed on the circuit board tab. A housing attached to the circuit board includes a housing tab extending from the housing, the housing tab being substantially parallel and adjacent to the circuit board tab, such that the circuit board tab and the housing tab together form a connecting tab.

Alternatively, an embodiment of the present invention may be summarized as a disc drive including a rotatable disc, a disc drive circuit board, and a connector for connecting the circuit board to a device outside the disc drive. The connector includes a substantially rectangular circuit board tab forming part of the circuit board and extending from it. Contact pads are formed on the circuit board tab. The connector also includes a housing attached to the circuit board that includes a housing tab extending from the housing in the first direction, the housing tab being substantially parallel to and abutting the circuit board tab, such that the housing tab and the circuit board tab together form a connecting tab.

Stated still another way, an embodiment of the present invention is a disc drive having a disc mounted for rotation on a spindle motor. The disc drive includes a printed circuit board and means for electrically and mechanically connecting the circuit board to a device outside the disc drive.

These and various other features as well as advantages which characterize the present invention will be apparent from a reading of the following detailed description and a review of the associated drawings.

DETAILED DESCRIPTION

Figure 1:
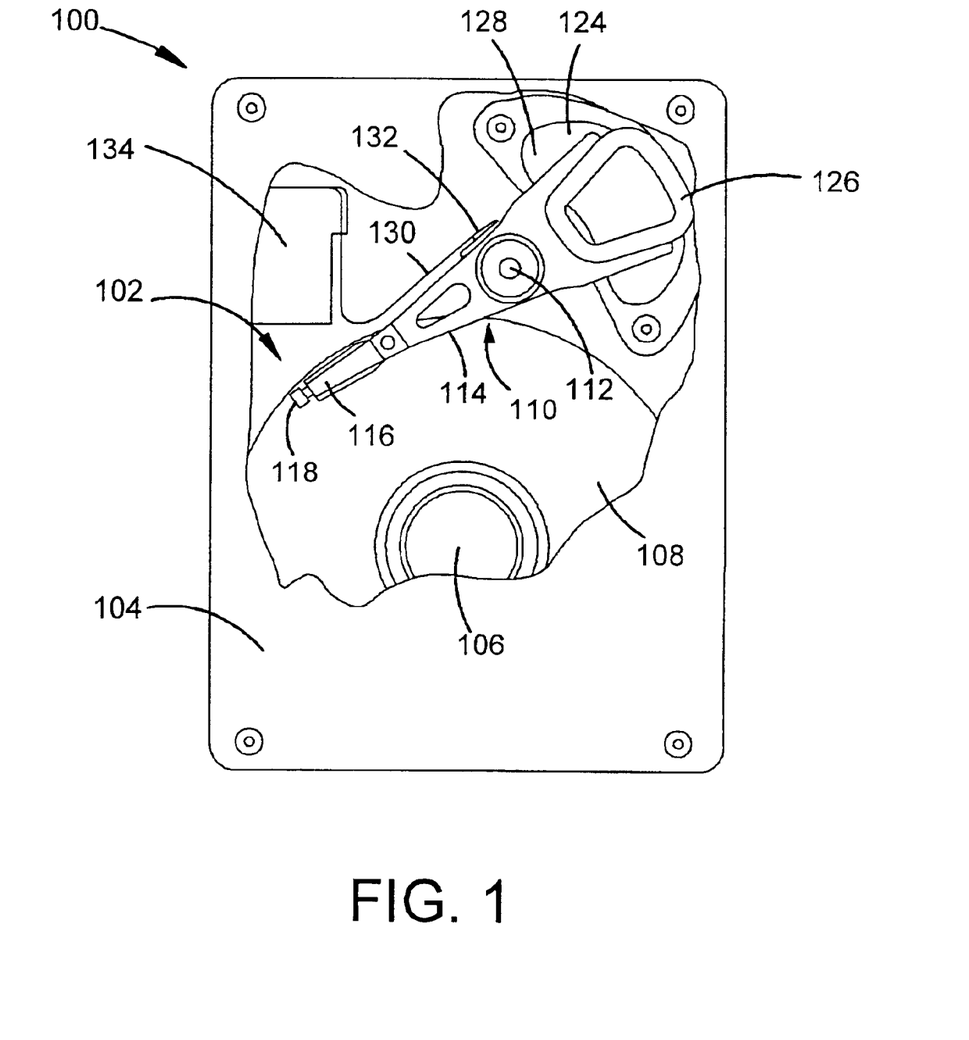
FIG. 1 is a plan view of a disc drive incorporating an embodiment of the present invention showing the primary internal components.

A disc drive 100 constructed in accordance with a preferred embodiment of the present invention is shown in FIG. 1. The disc drive 100 includes a base 102 to which various components of the disc drive 100 are mounted. A top cover 104, shown partially cut away, cooperates with the base 102 to form an internal, sealed environment for the disc drive in a conventional manner. The components include a spindle motor 106, which rotates one or more discs 108 at a constant high speed. Information is written to and read from tracks on the discs 108 through the use of an actuator assembly 110, which rotates during a seek operation about a bearing shaft assembly 112 positioned adjacent the discs 108. The actuator assembly 110 includes a plurality of actuator arms 114, which extend towards the discs 108, with one or more flexures 116 extending from each of the actuator arms 114. Mounted at the distal end of each of the flexures 116 is a head 118, which includes an air bearing slider enabling the head 118 to fly in close proximity above the corresponding surface of the associated disc 108.

During a seek operation, the track position of the heads 118 is controlled through the use of a voice coil motor 124, which typically includes a coil 126 attached to the actuator assembly 110, as well as one or more permanent magnets 128, which establish a magnetic field in which the coil 126 is immersed. The controlled application of current to the coil 126 causes magnetic interaction between the permanent magnets 128 and the coil 126 so that the coil 126 moves in accordance with the well-known Lorentz relationship. As the coil 126 moves, the actuator assembly 110 pivots about the bearing shaft assembly 112, and the heads 118 are caused to move across the surfaces of the discs 108.

A flex assembly 130 provides the requisite electrical connection paths for the actuator assembly 110 while allowing pivotal movement of the actuator assembly 110 during operation. The flex assembly includes a flex assembly circuit board 132 to which head wires (not shown) are connected; the head wires being routed along the actuator arms 114 and the flexures 116 to the heads 118. The flex assembly circuit board 132 typically includes circuitry for controlling the write currents applied to the heads 118 during a write operation and a preamplifier for amplifying read signals generated by the heads 118 during a read operation. The flex assembly terminates at a flex bracket 134 for communication through the base deck 102 to a disc drive printed circuit board (see FIGS. 2–7) mounted to the bottom side of the disc drive 100.

Figure 2:
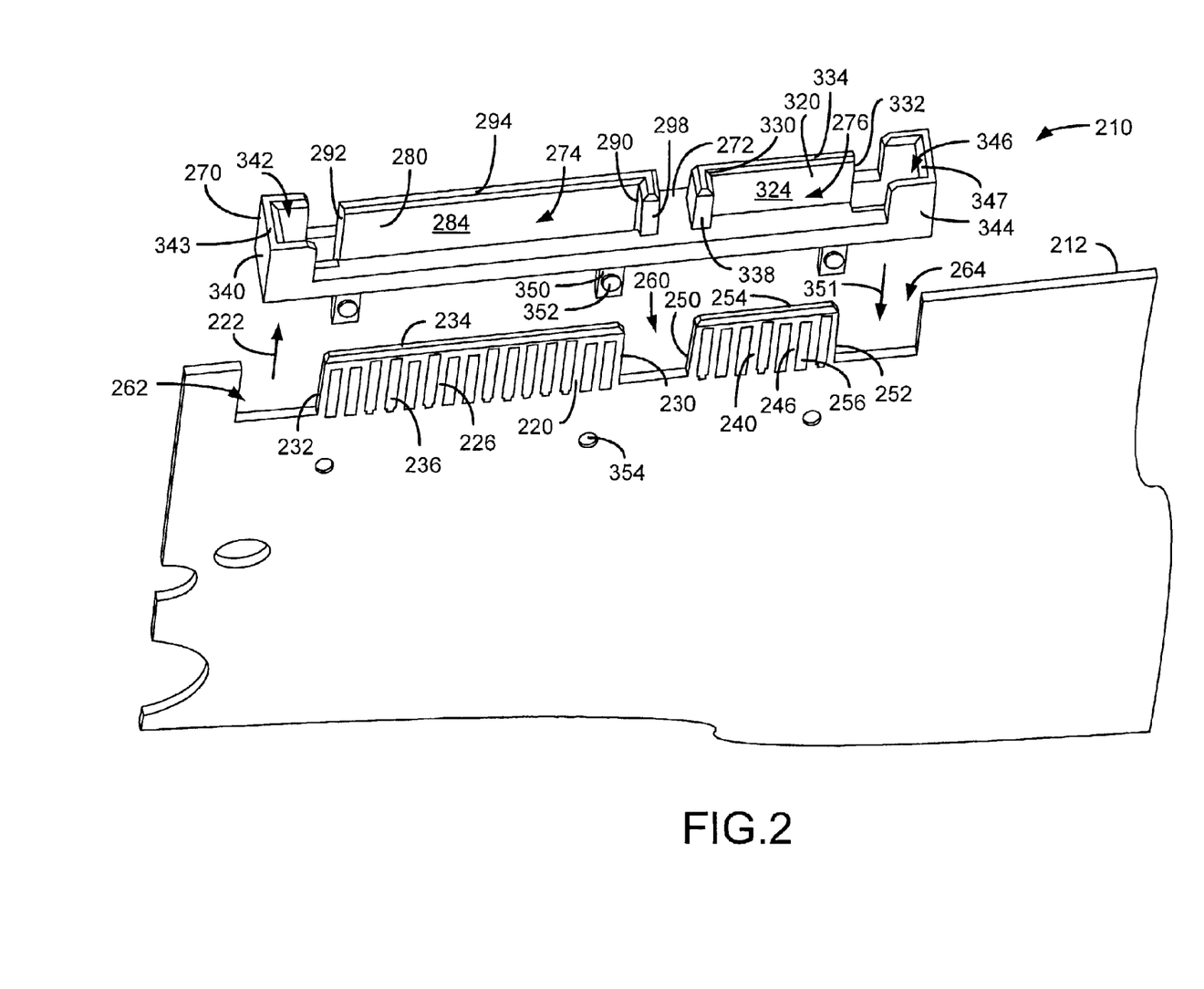
FIG. 2 is an exploded perspective view of a connector in accordance with an embodiment of the present invention.
Figure 3:
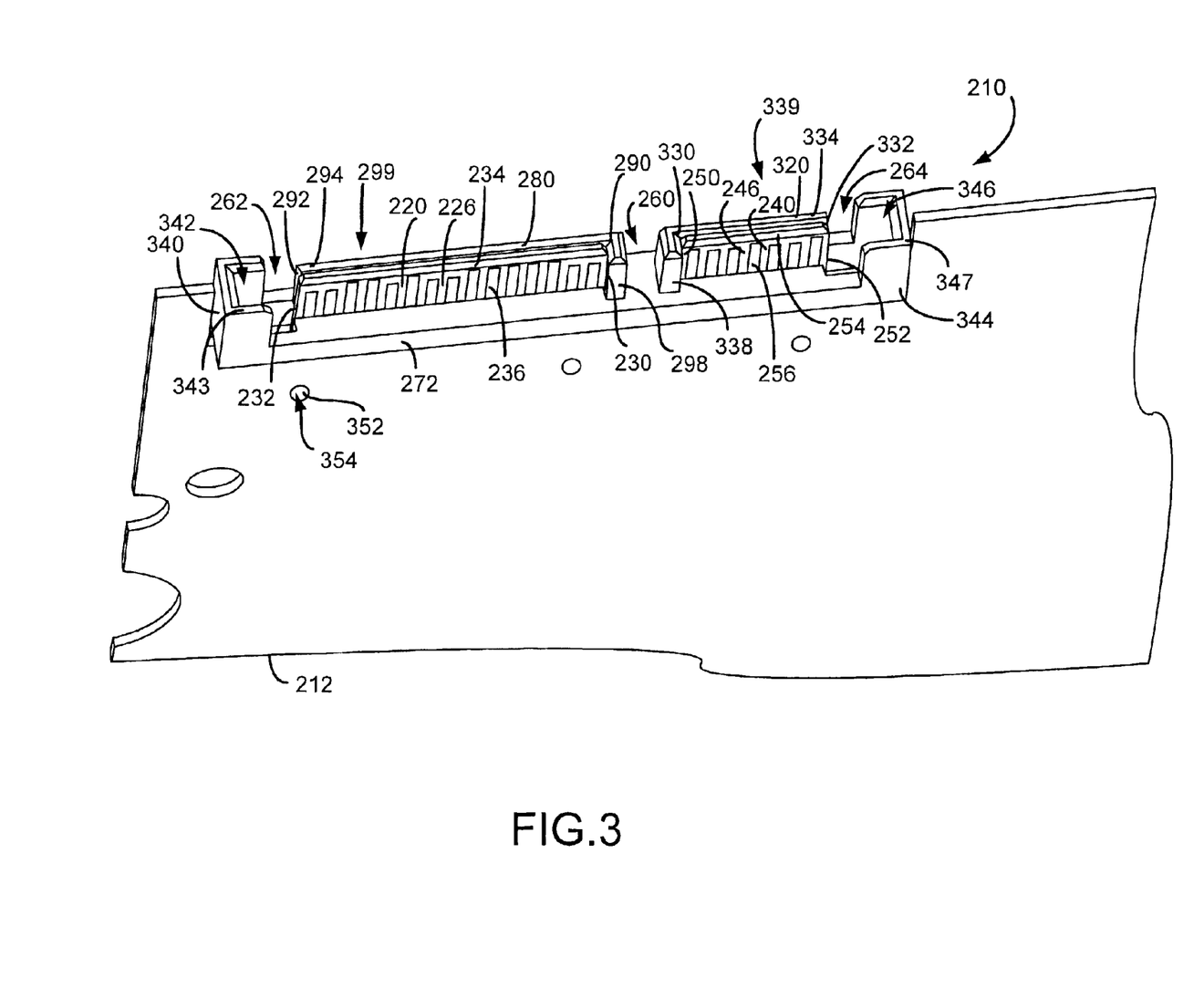
FIG. 3 is a perspective view of the connector of FIG. 2.

FIGS. 2–3 depict a device plug connector 210 for connecting a disc drive printed circuit board 212 to a device outside the disc drive 100. The connector 210 includes a first circuit board tab or power tab 220 that is an integral part of the circuit board 212, that is preferably substantially rectangular in shape, and that extends from the circuit board 212 in a first direction 222. The first circuit board tab 220 preferably includes a first major surface 224 (see FIG. 6) and an opposing second major surface 226. The first major surface 224 (see FIG. 6) and the second major surface 226 are joined by a first edge 230 extending in the first direction 222 and an opposing second edge 232 also extending in the first direction 222. A third edge 234 is distal from the body of the circuit board 212 and extends from the terminus of the second edge 232 to the terminus of the first edge 234 to form the terminus of the first circuit board tab 220. The third edge 234 is preferably beveled or rounded. The first circuit board tab 220 further includes electrically conductive contact pads 236 for supplying power to the disc drive via the circuit board 212.

Connector 210 preferably also includes a second circuit board tab or signal tab 240 that is preferably substantially rectangular in shape and extends from the circuit board 212 in the first direction 222. The second circuit board tab 240 preferably includes a first major surface 244 (see FIG. 6) and an opposing second major surface 246 that are both substantially flat and rectangular. The first major surface 244 (see FIG. 6) and the second major surface 246 are joined by a first edge 250 extending in the first direction and an opposing second edge 252 also extending in the first direction. The first edge 250 of the second circuit board tab 240 and the first edge 230 of the first circuit board tab 220 face toward each other while the second edge 252 of the second circuit board tab 240 and the second edge 232 of the first circuit board tab 220 face away from each other. A third edge 254 is distal from the body of the circuit board 212 and extends from the terminus of the second edge 252 to the terminus of the first edge 250 to form the terminus of the second circuit board tab 240. The third edge 254 is preferably beveled or rounded. The second circuit board tab 240 further includes electrically conductive contact pads 256 for conducting signals between outside devices and the disc drive 100 via the circuit board 212.

The circuit board 212 defines a gap 260 between the first edge 230 of the first circuit board tab 220 and the first edge 250 of the second circuit board tab 240. The circuit board 212 also defines a gap 262 adjacent the second edge 232 of the first circuit board tab 220 and a gap 264 adjacent the second edge 252 of the second circuit board tab 240.

Referring still to FIGS. 2–3, the connector 210 also includes a housing 270. The housing 270 preferably includes a substantially rectangular rear wall 272 defining a first slot 274 that receives the first circuit board tab 220 so that the first circuit board tab 220 extends through the rear wall 272. A second slot 276 in the rear wall 272 receives the second circuit board tab 240 so that the second circuit board tab 240 also extends through the rear wall 272. Preferably, the first slot 274 and the second slot 276 are both substantially rectangular windows, meaning that the rear wall 272 surrounds the circuit board tabs 220, 240 as shown to provide stability to the connector 210. However, one or both of the slots 274, 276 may be partially or fully opened on at least one side.

The housing 270 further includes a first housing tab 280 that is preferably substantially rectangular in shape and extends from the rear wall 272 along the first slot 274 in the first direction 222. The first housing tab 280 includes a first major surface 284 facing toward and preferably abutting the first major surface 224 (see FIG. 6) of first circuit board tab 220. First housing tab 280 also includes a second major surface 286 (see FIG. 6) that is opposite the first major surface 284. Preferably, the first major surface 284 and the second major surface 286 are both substantially flat and rectangular. The first major surface 284 and the second major surface 286 are joined by a first edge 290 extending in the first direction 222 and an opposing second edge 292 also extending in the first direction 222. The first edge 290 of the first housing tab 280 and the first edge 230 of the first circuit board tab 220 are adjacent to each other while the second edge 292 of the first housing tab 280 and the second edge 232 of the first circuit board tab 220 are adjacent to each other. A third edge 294 of the first housing tab 280 is distal from the rear wall 272 of the housing 270 and extends from the terminus of the second edge 292 to the terminus of the first edge 290 to form the terminus of the first housing tab 280. The third edge 294 is preferably beveled or rounded. The third edge 294 of the first housing tab 280 is preferably adjacent the third edge 234 of the first circuit board tab 220.

The housing 270 preferably also includes a first keying protrusion 298 that extends in the first direction 222 from the rear wall 272 and from the first edge 290 of the first housing tab 280 in a direction normal to the first housing tab 280. Thus, the first keying protrusion 298 and the first housing tab 280 together form an L-shaped protrusion from the rear wall 272 of the housing 270. The first circuit board tab 220 extends from the first keying protrusion 298 along the first housing tab 280 so that the first circuit board tab 220 and the first housing tab 280 together form a first connecting tab 299 (FIG. 3). The first housing tab 280 preferably defines locking recesses 296 in the second major surface 286 (see FIG. 6). The locking recesses 296 may extend completely through the first housing tab 280 or they may only extend part way through the first housing tab 280 depending on the thickness of the first housing tab 280. The locking recesses 296 receive locking protrusions from a mating receptacle connector as will be described in more detail below.

Still referring to FIGS. 2–3, the housing 270 preferably also includes a second housing tab 320 that is preferably substantially rectangular in shape and extends from the rear wall 272 along the second slot 276 in the first direction 222. The second housing tab 320 preferably includes a first major surface 324 facing toward and preferably abutting the first major surface 244 (see FIG. 6) of the second circuit board tab 240. The second housing tab 320 preferably also includes a second major surface 326 (see FIG. 6) that is opposite the first major surface 324. Preferably, the first major surface 324 and the second major surface 326 (see FIG. 6) are both substantially flat and rectangular. The first major surface 324 and the second major surface 326 (see FIG. 6) are joined by a first edge 330 extending in the first direction 222 and an opposing second edge 332 also extending in the first direction 222. The first edge 330 of the second housing tab 320 and the first edge 250 of the second circuit board tab 240 are adjacent to each other while the second edge 332 of the second housing tab 320 and the second edge 252 of the second circuit board tab 240 are adjacent to each other. A third edge 334 of the second housing tab 320 is distal from the rear wall 272 of the housing 270 and extends from the terminus of the second edge 332 to the terminus of the first edge 330 to form the terminus of the second housing tab 320. The third edge 334 is preferably beveled or rounded. The third edge 334 is adjacent the third edge 254 of the second circuit board tab 240.

The housing 270 preferably further includes a second keying protrusion 338 that extends in the first direction 222 from the rear wall 272. The second keying protrusion 338 also extends from the first edge 330 of the second housing tab 320 in a direction normal to the second housing tab 320 so that the second keying protrusion 338 and the second housing tab 320 together form an L-shaped protrusion from the rear wall 272 of the housing 270. The second circuit board tab 240 extends from the second keying protrusion 338 along the second housing tab 320 so that the second circuit board tab 240 and the second housing tab 320 together form a second connecting tab 339 (FIG. 3). The second housing tab 320 preferably defines a locking recess 336 in the second major surface 326 (see FIG. 6). The locking recess 336 may extend through the second housing tab 320 or it may extend only partially through the second housing tab 320. The locking recess 336 receives locking protrusions from a mating receptacle connector as will be described in more detail below.

A first generally U-shaped section 340 extends in the first direction 222 from the end of the rear wall 272 that is proximal the first housing tab 280. The first U-shaped section 340 defines a first channel 342 that opens toward the first housing tab 280. The first U-shaped section 340 terminates in a U-shaped edge 343 that is preferably beveled or rounded inwardly toward the first channel 342. A second generally U-shaped section 344 extends in the first direction 222 from the end of the rear wall 272 that is proximal the second housing tab 320. The second U-shaped section 344 defines a second channel 346 that opens toward the second housing tab 320. The second U-shaped section 344 also terminates in a generally U-shaped edge 347 that is preferably beveled or rounded inwardly toward the second channel 346.

The housing 270 shown in FIGS. 2–3 further includes snap levers 350 extending from the rear wall 272 in a second direction 351 opposite from the first direction 222 along the circuit board 212. Each snap lever 350 includes a protrusion 352 that engages a mating recess or hole 354 in the circuit board 212. The protrusions 352 and the recesses 354 are preferably circular, but they can be any of various shapes so long as the protrusions 352 can securely engage the recesses 354.

While the connector 210 preferably includes two connecting tabs 299, 339 (FIG. 3) as described above, the present invention also encompasses the use of only one connecting tab or more than two connecting tabs. Moreover, while in a preferred embodiment the connector 210 complies with the dimensional requirements for the serialized ATA standard, which are known to those skilled in the art, the dimensions of the connector 210 may vary depending on the specific situation.

Figure 4:
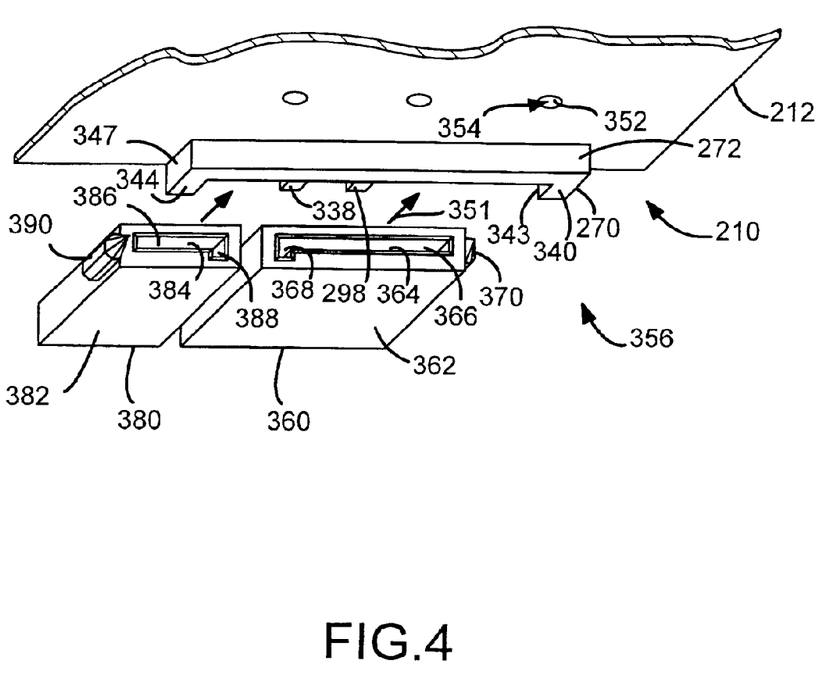
FIG. 4 is a partially exploded perspective view of an interface including the connector of FIG. 3 and further including receptacle connectors.

Referring now to FIG. 4, an interface 356 includes the connector 210 and further includes a first receptacle connector 360 that is electrically connected to a device outside the disc drive 100, such as a host computer. The first receptacle connector 360 includes a housing 362 that defines a mating recess 364, which preferably includes a tab slot 366 that receives the first connecting tab 299 (see FIG. 3) and a keying slot 368 that extends normal to the tab slot 366 to receive the first keying protrusion 298. Thus, the mating recess 364 forms an L-shaped recess to mate with the L-shaped protrusion formed by the first keying protrusion 298 and the first connecting tab 299 (see FIG. 3). The first receptacle connector 360 preferably also includes locking protrusions (not shown) that extend into the tab slot 366 to engage the locking recesses 296 (see FIG. 6) of the first housing tab 280. The first receptacle connector 360 preferably also includes a protrusion or guide 370 extending from a side of the housing 362 opposite the keying slot 368. The guide 370 preferably includes beveled or rounded surfaces and fits within the first channel 342 (see FIG. 3).

The interface 356 further includes a second receptacle connector 380 that is electrically connected to a device outside the disc drive 100, such as a host computer. The second receptacle connector 380 includes a housing 382 that defines a mating recess 384. The mating recess 384 includes a tab slot 386 that receives the second connecting tab 339 and a keying slot 388 that extends normal to the tab slot 386 to receive the second keying protrusion 338. Thus, the mating recess 384 is an L-shaped recess to mate with the L-shaped protrusion formed by the second keying protrusion 338 and the second connecting tab 339 (see FIG. 3). The second receptacle connector 380 preferably also includes a locking protrusion (not shown) that extends into the tab slot 386 to engage the locking recess 336 (see FIG. 6) of the second housing tab 320. The second receptacle connector 380 also includes a protrusion or guide 390 extending from a side of the housing 382 distal from the keying slot 388. The guide 390 preferably includes beveled or rounded surfaces and fits within the second channel 346.

The receptacle connectors 360, 380 can be constructed according to known manufacturing methods or standard receptacle connectors can be used. The receptacle connectors can be separate connectors as shown in FIG. 4, or they can be combined to form one integral receptacle connector that mates with both connecting tabs. Additionally, the receptacle connectors can be remotely connected to an external device, such as by cables, or they can be host receptacle connectors that are mounted directly to the external device (e.g., mounted to the back plane of a drive bay). Also, the present invention can be used in an embodiment that includes only one receptacle connector or that includes more than two receptacle connectors.

If the host receptacle connectors 360, 380 are mounted on the back plane of a drive bay, several features of the housing 270 can be omitted without adversely affecting the performance of the connector 210. For example, the locking recesses 296, 336 could be omitted because the drive will remain connected to the back plane receptacle connectors even without such features. Also, the keying protrusions 298, 338 could be omitted because the drive could be properly oriented with respect to the drive bay without such features.

If the drive 100 were to be used only with receptacle connectors connected to cables, then the generally U-shaped sections 340, 344 could be omitted because a user could visually guide the connector 210 into engagement with the corresponding receptacle connectors 360, 380. However, in a backplane environment, the U-shaped sections 340, 344 aid in blindly mating the connector 210 into engagement with the corresponding receptacle connectors 360, 380. Nevertheless, the embodiment described above and shown in the figures is preferred because it provides optimal performance whether the drive 100 is used in a backplane environment or a cable connection environment.

In a preferred embodiment of the present invention, the interface 356 complies with the dimensional requirements of the serialized ATA standard, which are known to those skilled in the art. For example, in a preferred embodiment the first connecting tab 299 has a thickness (i.e., a distance between the second major surface 226 of the first circuit board tab 220 and the second major surface 286 of the first housing tab 280) of about 1.23 mm. If the circuit board 212 has a particular thickness, then the thickness of the first housing tab 280 can be chosen so that the first circuit board tab 220 and the first housing tab 280 together produce the desired thickness of the resulting connecting tab 299. The tab slot 366 of the corresponding first receptacle connector 360 preferably has a thickness slightly larger than the thickness of the connecting tab 299. In a preferred embodiment, the tab slot 366 has a thickness of about 1.4 mm. The second connecting tab 339 also has a thickness of about 1.23 min and the tab slot of the second receptacle connector 380 has a thickness of about 1.4 mm.

In making the connector 210, the circuit board 212 can be manufactured according to well-known methods. During such manufacturing, the features discussed herein, such as tabs, gaps, recesses, and contact pads are preferably formed in the circuit board 212 as an integral part of the normal manufacturing processes. The housing 270 is preferably formed out of a stiff and inexpensive material. In a preferred embodiment, the housing 270 is molded from a fiber-reinforced thermoplastic, such as a fiberglass-reinforced thermoplastic. The manufacturing process for the connector 210 is simplified because contact pads or other electrical leads need not be formed in the housing 270.

Referring now to FIGS. 2–4, the housing 270 is secured to the circuit board 212 by sliding the housing 270 onto the circuit board in a direction opposite to the first direction 222 so that the first circuit board tab 220 and the second circuit board tab 240 slide through the first slot 274 and the second slot 276, respectively. The beveled third edges 234, 254 of the circuit board tabs 220, 240, respectively, aid in guiding the circuit board tabs 220, 240 into the slots 274, 276, respectively. Once the housing 270 is properly positioned on the circuit board 212, the protrusions 352 of the snap levers 350 snap into engagement with the corresponding recesses 354 in the circuit board 212 to secure the housing 270 to the circuit board 212. This easy attachment of the housing 270 to the circuit board 212 distinguishes prior ATA connector housings, which require that solder contacts from the housing be joined with solder contacts from the circuit board during manufacturing.

With the housing 270 secured to the circuit board 212, receptacle connectors 360, 380 can easily be electrically and mechanically attached to the circuit board 212 to form interface 356. The first receptacle connector 360 slides into engagement by sliding the guide 370 within the first channel 342 so that the first connecting tab 299 and the first keying protrusion 298 slide into the tab slot 366 and the keying slot 368, respectively, of the mating recess 364. The beveled third edge 234 of the first circuit board tab 220, the beveled third edge 294 of the first housing tab 280, the beveled entry of the mating recess 364, the beveled surfaces of the guide 370, and the beveled edges of the first U-shaped section 340 all aid in guiding the first receptacle connector 360 into a proper mating relationship with the first circuit board tab 220 and the housing 270. Once the first receptacle connector 360 is properly positioned with respect to the first circuit board tab 220 and the housing 270, projections from the first receptacle connector 360 engage the locking recesses 296 formed in the first housing tab 280 to secure the receptacle connector 360 to the housing 270 and thus to the circuit board 212. The contact pads 236 on the first circuit board tab 220 contact electrically conductive elements of the first receptacle connector 360, thereby electrically connecting the contact pads 236, and thus the disc drive 100, to an external device such as a host computer.

The second receptacle connector 380 similarly slides into engagement by sliding the guide 390 within the second channel 346 so that the second connecting tab 339 and the second keying protrusion 338 slide into the tab slot 386 and the keying slot 388, respectively, of the mating recess 384. The beveled third edge 254 of the second circuit board tab 240, the beveled third edge 334 of the second housing tab 320, the beveled entry of the mating recess 384, the beveled surfaces of the guide 390, and the beveled edges of the second U-shaped section 344 all aid in guiding the second receptacle connector 380 into a proper mating relationship with the second circuit board tab 240 and the housing 270. Once the second receptacle connector 380 is properly positioned with respect to the second circuit board tab 240 and the housing 270, a projection from the second receptacle connector 380 engages the locking recess 336 formed in the second housing tab 320 to secure the receptacle connector 380 to the housing 270 and thus to the circuit board 212. The contact pads 256 on the second circuit board tab 240 contact electrically conductive elements of the second receptacle connector 380, thereby electrically connecting the contact pads 256, and thus the disc drive 100, to an external device such as a host computer.

Figure 5:
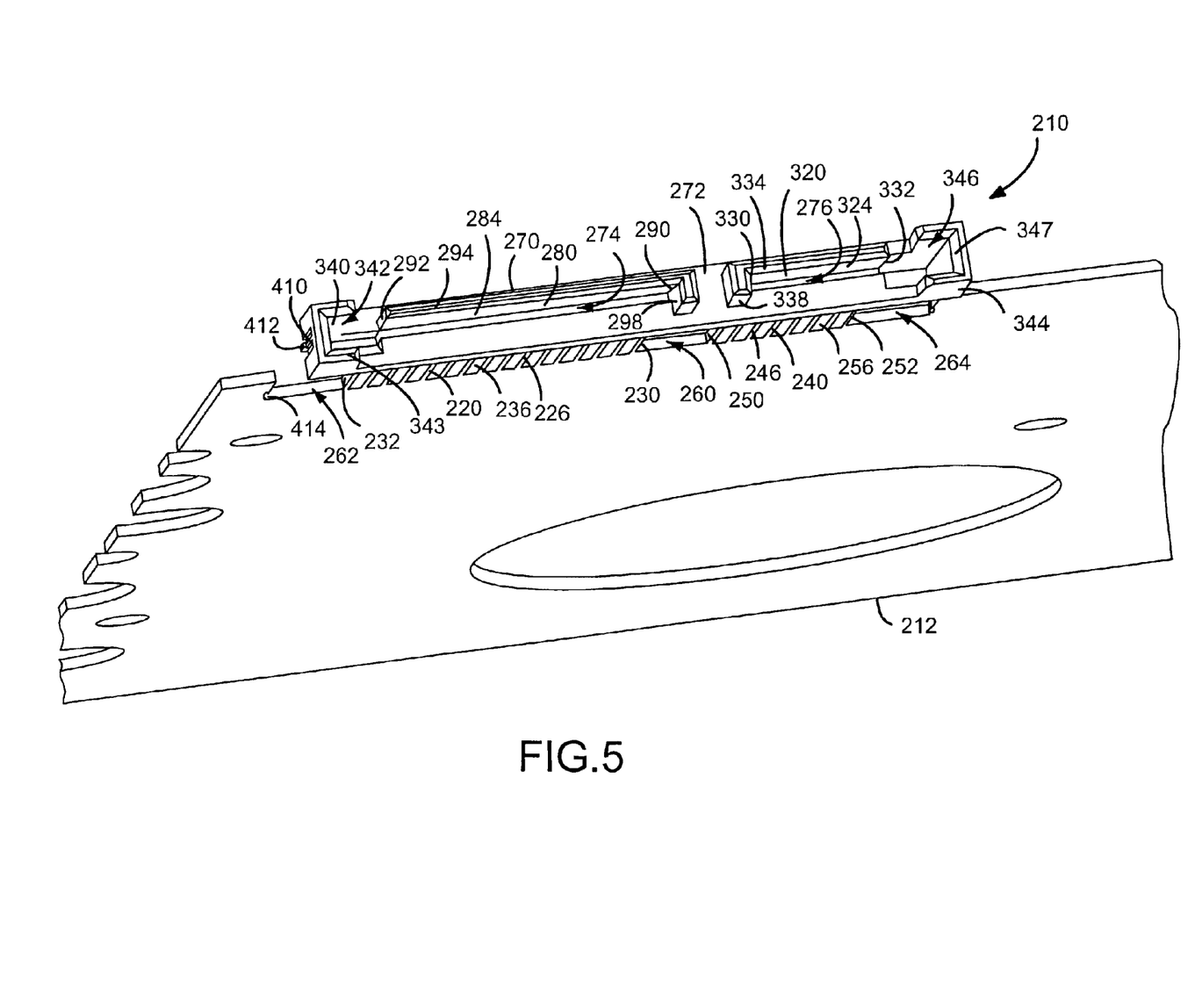
FIG. 5 is an exploded perspective view of a connector in accordance with an alternative embodiment of the present invention.
Figure 6:
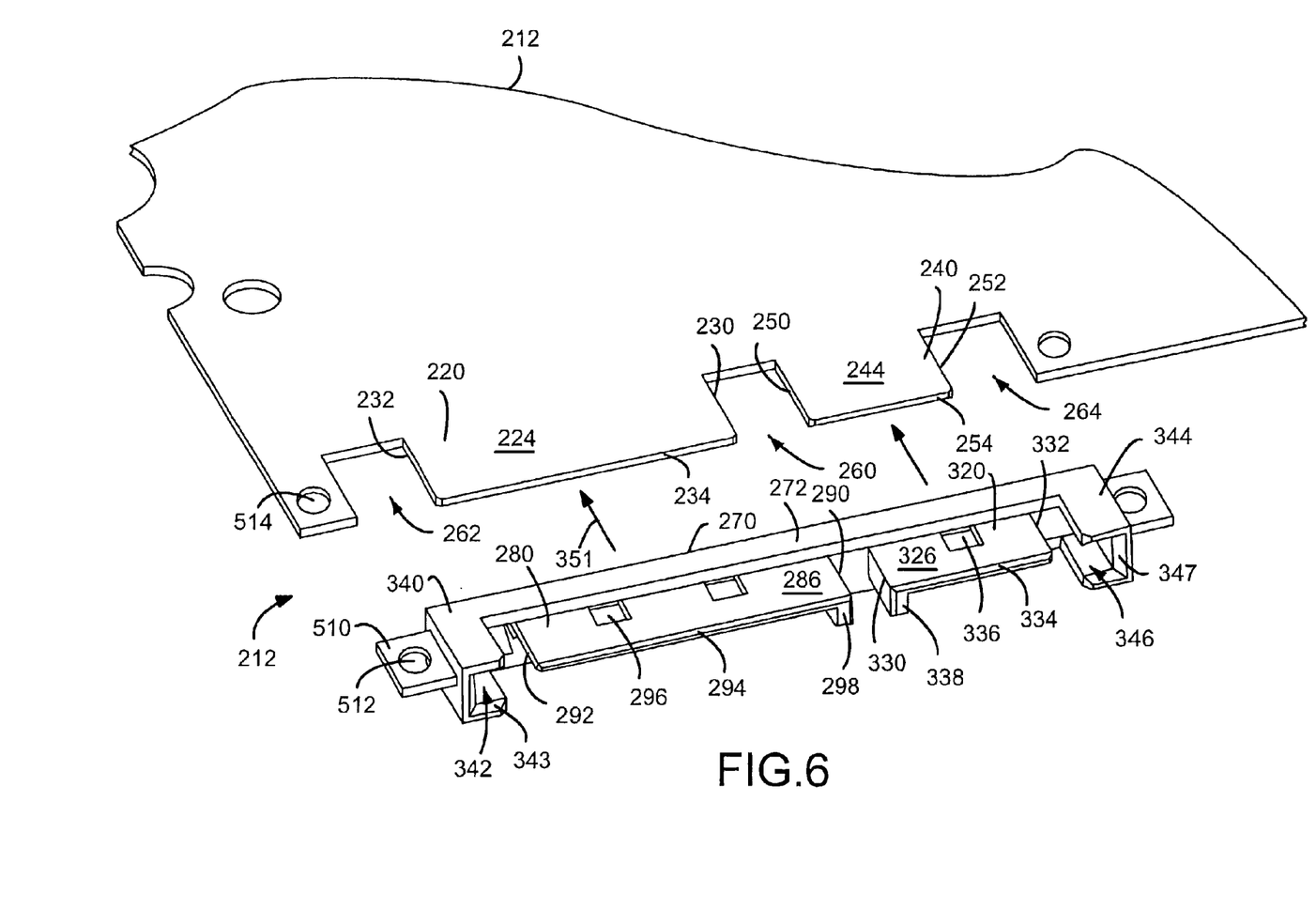
FIG. 6 is an exploded perspective view of a connector in accordance with an alternative embodiment of the present invention.
Figure 7:
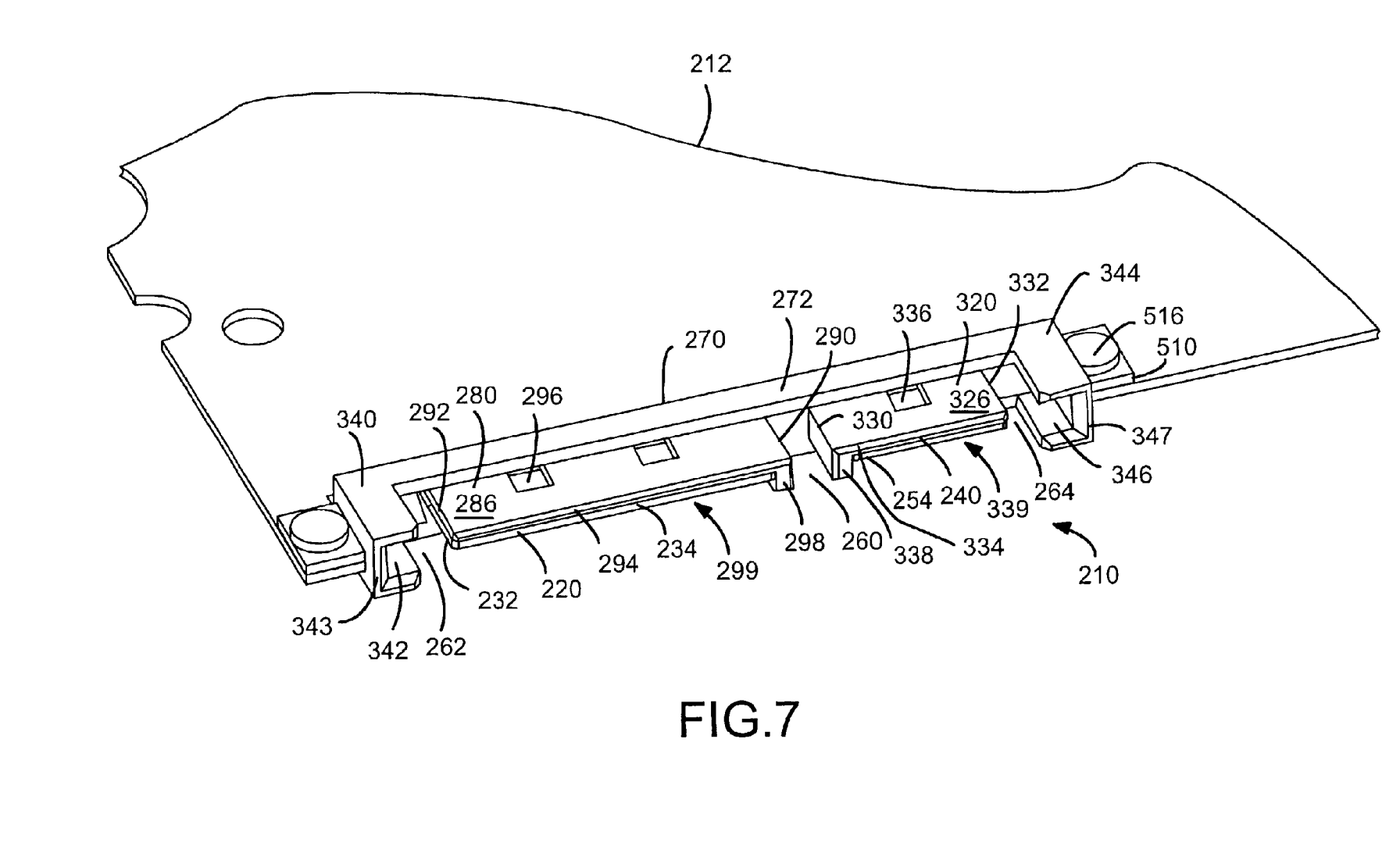
FIG. 7 is a perspective view of the connector of FIG. 6.

FIGS. 5–7 depict alternative embodiments of the present invention that are similar to the embodiment of FIGS. 2–4, except they embody alternative connections between the housing 270 and the circuit board 212. When referring to FIGS. 5–7, the same reference numerals will be used for like features, but new reference numerals will be used for the specific features that differ from the embodiment of FIGS. 2–4. Additionally, only those features that differ from the embodiment of FIGS. 2–4 will be described. Referring now to FIG. 5, an integral snap lever 410 extends from each of the U-shaped sections 340, 344 in the second direction 351 (see FIG. 2). Each snap lever 410 moves in substantially the same plane as the circuit board 212 and includes a protrusion 412 at its terminus that extends away from the housing 270. The circuit board 212 defines opposing recesses 414 in the edges of the circuit board 212 that face toward the gaps 262, 264 that are on opposite sides of the circuit board tabs 220, 240. Thus, when the housing 270 is properly positioned on the circuit board 212 as described above, the snap levers 410 bias the protrusions 412 into engagement with the recesses 414 to secure the housing 270 to the circuit board 212.

Referring now to FIGS. 6–7, the housing 270 includes integral ears 510 that extend from the U-shaped sections 340, 344 in opposing directions. Each ear 510 preferably defines a hole 512 that is coaxial with a corresponding hole 514 in the circuit board 212. When the housing 270 is properly positioned on the circuit board 212 as described above, the corresponding holes 512 514 align. In a preferred embodiment, the holes 512, 514 also align with receiving holes (not shown) in the base 102 of disc drive 100. Fasteners 516, such as screws, can then be secured through the holes 512, 514 and into the receiving holes of the base 102 to secure the housing 270 and the circuit board 212 to the base 102. Alternatively, the fasteners 516 can extend only through holes 512, 514 and not into the base 102.

While the embodiments shown preferably comply with the serialized ATA standards, the present invention can also simplify other circuit board edge connectors. The circuit board edge connector 210 can mate with a receptacle 360 or 380 in a manner similar to the way that a separately attached connector would mate with a receptacle. However, this embodiment of the present invention does not require a separately attached connector or housing with electrical connections.

Because the thickness of each housing tab 280 or 320 can be chosen to produce a desired thickness of the resulting connecting tab 299 or 339, respectively, the connector 210 provides the benefits of prior interface connectors with decreased manufacturing costs. The costs of manufacturing the connector 210 are decreased because the housing 270 need not incorporate contact pads, electrical leads, or solder contacts. Also, no electrical connection between the housing 270 and the circuit board 212 is needed because the contact pads 236 and 256 are formed directly on the circuit board 212. Thus, the connector 210 need not be handled as delicately as prior connectors during manufacturing. The connector 210 can also be more robust during normal use because an electrical connection between the housing 270 and the circuit board 212 need not be maintained.

An embodiment of the present invention may be summarized as a connector (such as 210) for connecting a disc drive circuit board (such as 212) to a device outside the disc drive (such as 100). The connector (such as 210) includes a circuit board tab (such as 220 or 240) forming part of the circuit board (such as 212) and extending from the circuit board (such as 212) in a first direction (such as 222). Contact pads (such as 236 or 256) are formed on the circuit board tab (such as 220 or 240). The connector (such as 210) also includes a housing (such as 270) attached to the circuit board (such as 212). The housing (such as 270) includes a housing tab (such as 280 or 320) extending from the housing (such as 270) in the first direction (such as 222), the housing tab (such as 280 or 320) being substantially parallel and adjacent to the circuit board tab (such as 220 or 240), such that the circuit board tab (such as 220 or 240) and the housing tab (such as 280 or 320) together form a connecting tab (such as 299 or 339).

The housing tab (such as 280 or 320) preferably has a first major surface (such as 284 or 324) facing toward the circuit board tab (such as 220 or 240) and a second major surface (such as 286 or 326) facing away from the circuit board tab (such as 220 or 240), and the first major surface (such as 284 or 324) of the housing tab (such as 280 or 320) preferably abuts the circuit board tab (such as 220 or 240). The second major surface (such as 286 or 326) of the housing tab (such as 280 or 320) preferably defines a locking recess (such as 296 or 336) for engaging a projection in a receptacle (such as 360 or 380) connected to the device to secure the connector (such as 210) within the receptacle (such as 360 or 380).

The housing (such as 270) may further include a keying protrusion (such as 298 or 338) extending in the first direction (such as 222) along an edge (such as 290 or 230) of the housing tab (such as 280 or 320) and extending substantially normal to the housing tab (such as 280 or 320). Moreover, the connector may further include a second circuit board tab (such as 220 or 240) forming part of the circuit board (such as 212) and extending from the circuit board (such as 212) in a first direction (such as 222), the second circuit board tab (such as 220 or 240) having contact pads (such as 236 or 256) formed on it. The housing preferably includes a second housing tab (such as 280 or 320) extending from the housing (such as 270) in the first direction (such as 222) and a second keying protrusion (such as 298 or 238) extending in the first direction (such as 222) along an edge (such as 290 or 330) of the second housing tab (such as 280 or 320) and extending substantially normal to the second housing tab (such as 280 or 320), the second housing tab (such as 280 or 320) being substantially parallel and adjacent to the second circuit board tab (such as 220 or 240).

The housing tab (such as 280 or 320) and the keying protrusion (such as 298 or 338) preferably adjoin to form a substantially L-shaped protrusion from the housing (such as 270). Preferably, the circuit board tab (such as 220 or 240) includes a first edge (such as 230 or 250) extending in the first direction (such as 222) and an opposing second edge (such as 232 or 252), wherein the keying protrusion (such as 298 or 338) is adjacent the first edge (such as 230 or 250), and wherein the housing (such as 270) defines a channel (such as 342 or 346) extending in the first direction (such as 222) adjacent the second edge (such as 232 or 252). Also in a preferred embodiment, the circuit board tab (such as 220 or 240) extends through a slot (such as 274 or 276) defined by the housing (such as 270), and the slot (such as 274 or 276) is a window.

In a preferred embodiment, the circuit board tab (such as 220 or 240) includes a first edge (such as 230 or 250) extending in the first direction (such as 222), an opposing second edge (such as 232 or 252) extending in the first direction (such as 222), and a third edge (such as 234 or 254) joining the first edge (such as 230 or 250) and the second edge (such as 232 or 252) to form a terminus of the circuit board tab (such as 220 or 240), wherein the housing tab (such as 280 or 320) includes a first edge (such as 290 or 330) extending in the first direction (such as 222), an opposing second edge (such as 292 or 332) extending in the first direction (such as 222), and a third edge (such as 294 or 334) joining the first edge (such as 290 or 330) and the second edge (such as 292 or 332) to form a terminus of the housing tab (such as 280 or 320), and wherein the first edge (such as 230 or 250) of the circuit board tab (such as 220 or 240) is adjacent the first edge (such as 290 or 330) of the housing tab (such as 280 or 320), the second edge (such as 232 or 252) of the circuit board tab (such as 220 or 240) is adjacent the second edge (such as 292 or 332) of the housing tab (such as 280 or 320), and wherein the third edge (such as 234 or 254) of the circuit board tab (such as 220 or 240) is adjacent the third edge (such as 294 or 334) of the housing tab (such as 280 or 320).

The housing (such as 270) may also include an integral protrusion (such as 352 or 412) that mates with a recess (such as 354 or 414) in the circuit board (such as 212) to secure the housing (such as 270) to the circuit board (such as 212). Alternatively, the connector (such as 210) may include a fastener (such as 516) that extends through the circuit board (such as 212) and the housing (such as 270) to secure the housing (such as 270) to the circuit board (such as 212).

Stated another way, an embodiment of the present invention may be summarized as a disc drive (such as 100) including a rotatable disc (such as 108), a disc drive circuit board (such as 212), and a connector (such as 210) for connecting the circuit board (such as 212) to a device outside the disc drive (such as 100). The connector (such as 210) includes a substantially rectangular circuit board tab (such as 220 or 240) forming part of the circuit board (such as 212) and extending from the circuit board (such as 212) in a first direction (such as 222). Contact pads (such as 236 or 256) are formed on the circuit board tab (such as 220 or 240). The connector (such as 210) also includes a housing (such as 270) attached to the circuit board (such as 212). The housing (such as 270) includes a housing tab (such as 280 or 320) extending from the housing (such as 270) in the first direction (such as 222), the housing tab (such as 280 or 320) being substantially parallel to and abutting the circuit board tab (such as 220 or 240), such that the housing tab (such as 280 or 320) and the circuit board tab (such as 220 or 240) together form a connecting tab (such as 299 or 339).

The connector (such as 210) may further include a second substantially rectangular circuit board tab (such as 220 or 240) forming part of the circuit board (such as 212) and extending in the first direction (such as 222) from the circuit board (such as 212). Contact pads (such as 236 or 256) are preferably formed on the second circuit board tab (such as 220 or 240). Moreover, the housing (such as 270) preferably further includes a second housing tab (such as 280 or 320) extending from the housing in the first direction (such as 222), the second housing tab (such as 280 or 320) being substantially parallel to and abutting the second circuit board tab (such as 220 or 240) such that the second housing tab (such as 280 or 320) and the second circuit board tab (such as 220 or 240) together form a second connecting tab (such as 299 or 339). Moreover, the housing (such as 270) preferably further includes a first keying protrusion (such as 298 or 338) substantially normal to the first aforesaid housing tab (such as 280 or 320) extending in the first direction (such as 222) along an edge (such as 290 or 330) of the first housing tab (such as 280 or 320), and wherein the housing (such as 270). The housing (such as 270) may further include a second keying protrusion (such as 298 or 338) substantially normal to the second housing tab (such as 280 or 320) extending in the first direction (such as 222) along an edge (such as 290 or 330) of the second housing tab (such as 280 or 320).

Stated still another way, an embodiment of the present invention is a disc drive (such as 100) having a disc (such as 108) mounted for rotation on a spindle motor (such as 106). The disc drive includes a printed circuit board (such as 212) and means (such as 210) for electrically and mechanically connecting the circuit board (such as 212) to a device outside the disc drive (such as 100). Preferably, the means (such as 210) for connecting includes electrically conductive contact pads (such as 236 or 256) formed on a tab of the printed circuit board (such as 212) and means (such as 270) secured to the printed circuit board (such as 212) for positioning the contact pads (such as 236 or 256) within a slot (such as 366 or 386) of a receptacle connector (such as 360 or 380).

It will be clear that the present invention is well adapted to attain the ends and advantages mentioned as well as those inherent therein. While embodiments have been described for purposes of this disclosure, various changes and modifications may be made which are well within the scope of the present invention. For example, the keying protrusions may be omitted. Such protrusions are useful for keying (i.e., assuring the correct orientation between mating members), but a skilled user can determine the correct orientation before sliding the receptacle connectors into a mating position. Numerous other changes may be made which will readily suggest themselves to those skilled in the art and which are encompassed in the scope of the invention disclosed and as defined in the appended claims.

What is claimed is:

1. A connector for connecting a disc drive circuit board to a device outside a disc drive, the connector comprising:
   at least one circuit board tab forming part of the circuit board and extending from the circuit board in a first direction, with contact pads being formed on the at least one circuit board tab; and
   a housing attached to the circuit board, the housing including at least one housing tab extending from the housing in the first direction, the at least one housing tab being substantially parallel and adjacent to the at least one circuit board tab, such that the at least one circuit board tab and the at least one housing tab together form at least one connecting tab.

2. The connector of claim 1, wherein the housing includes an integral protrusion that mates with a recess in the circuit board to secure the housing to the circuit board.

3. The connect of claim 1, further including a fastener that extends through the circuit board and the housing to secure the housing to the circuit board.

4. The connector of claim 1, wherein:
   the at least one housing tab has a first major surface facing toward the at least one circuit board tab and a second major surface facing away from the at least one circuit board tab, the first major surface of the at least one housing tab abutting the at least one circuit board tab; and
   the contact pads are formed on a surface of the at least one circuit board tab that faces away from the at least one housing tab.

5. The connector of claim 1, wherein the second major surface of the at least one housing tab defines a locking recess for engaging a projection in a receptacle that is connected to the device to secure the connector within the receptacle.

6. The connector of claim 1, wherein the at least one circuit board tab extends through a slot defined by the housing.

7. The connector of claim 6, wherein the slot is a window.

8. The connector of claim 1, wherein the housing further includes a first keying protrusion extending in the first direction along an edge of the at least one housing tab and extending substantially normal to the at least one housing tab.

9. The connector of claim 8, wherein:
   the at least one circuit board tab includes two circuit board tabs forming part of the circuit board and extending from the circuit board in the first direction, with the contact pads formed on the circuit board tabs;
   the at least one housing tab includes two housing tabs extending from the housing in the first direction; and
   the housing further includes a second keying protrusion, the first aforesaid keying protrusion extending in the first direction along an edge of a first housing tab of the two housing tabs and extending substantially normal to the first housing tab, and the second keying protrusion extending in the first direction along an edge of a second housing tab of the two housing tabs and extending substantially normal to the second housing tab.

10. The connector of claim 8, wherein the at least one housing tab and the keying protrusion adjoin to form substantially L-shaped protrusion from the housing.

11. The connector of claim 8, wherein the at least one circuit board tab includes a first edge extending in the first direction and an opposing second edge, wherein the keying protrusion is adjacent the first edge, and wherein the housing defines a channel extending in the first direction adjacent the second edge.

12. A disc drive comprising a rotatable disc, a disc drive circuit board, and a connector for connecting the circuit board to a device outside the disc drive, the connector comprising:

a substantially rectangular circuit board tab forming part of the circuit board and extending from the circuit board tab in a first direction, with contact pads formed on the circuit board tab; and a housing attached to the circuit board, the housing including a housing tab extending from the housing in the first direction, the housing tab being substantially parallel to and abutting the circuit board tab such that the housing tab and the circuit board tab together form a connecting tab.

13. The disc drive of claim 12, wherein the housing includes an integral protrusion that mates with the circuit board to secure the housing to the circuit board.

14. The disc drive of claim 12, further including a second substantially rectangular circuit board tab forming part of the circuit board and extending in the first direction from the circuit board, with contact pads formed on the second circuit board tab, wherein the housing further includes a second housing tab extending from the housing in the first direction, the second housing tab being substantially parallel to and abutting the second circuit board tab such that the second housing tab and the second circuit board tab together form a second connecting tab.

15. The disc drive of claim 14, wherein the housing further includes a first keying protrusion substantially normal to the first aforesaid housing tab extending in the first direction along an edge of the first housing tab, and wherein the housing further includes a second keying protrusion substantially normal to the second housing tab extending in the first direction along an edge of the second housing tab.

16. The disc drive of claim 14, wherein the first aforesaid circuit board tab extends through a first window defined by the housing and wherein the second circuit board tab extends through a second window defined by the housing.

17. The disc drive of claim 14, wherein the second major surface of the first aforesaid housing tab defines a first locking recess for engaging a projection in a first receptacle and wherein the second major surface of the second housing tab defines a second locking recess for engaging a projection in a second receptacle.

18. The disc drive of claim 14, wherein the housing defines a first channel extending in the first direction adjacent the first aforesaid housing tab for mating with a first receptacle and an opposing second channel extending in the first direction adjacent the second housing tab for mating with a second receptacle.

19. A disc drive having a disc mounted for rotation on a spindle motor, the disc drive comprising:

a printed circuit board; and means for electrically and mechanically connecting the circuit board to a device outside the disc drive.

20. The disc drive of claim 19, wherein the means for positioning the contact pads comprises a housing attached to the printed circuit board adjacent the tab of the printed circuit board.

* * * * *